United States Patent [19]

Yamagishi et al.

[11] Patent Number: 4,642,694

[45] Date of Patent: Feb. 10, 1987

[54] TELEVISION VIDEO SIGNAL A/D CONVERTER

[75] Inventors: Koji Yamagishi; Takahiro Fuse; Masao Kawamura; Shinichi Matsui, all of Tokyo, Japan

[73] Assignee: Casio Computer Co., Ltd., Tokyo, Japan

[21] Appl. No.: 733,583

[22] Filed: May 13, 1985

[30] Foreign Application Priority Data

| May 22, 1984 | [JP] | Japan | 59-103034 |
| Mar. 8, 1985 | [JP] | Japan | 60-46032 |
| Mar. 8, 1985 | [JP] | Japan | 60-46033 |

[51] Int. Cl.⁴ .............................................. H04N 5/74
[52] U.S. Cl. ..................................... 358/236; 358/160; 358/169; 307/358
[58] Field of Search ................ 358/236, 160, 230, 39, 358/169, 21 R, 23; 350/332; 340/784; 307/358, 359

[56] References Cited

U.S. PATENT DOCUMENTS

| 4,064,484 | 12/1977 | Mese et al. ...................... 358/169 X |
| 4,101,839 | 7/1978 | Poole et al. ..................... 307/358 X |
| 4,395,732 | 7/1983 | Upton ................................. 358/169 |
| 4,403,253 | 9/1983 | Morris et al. ...................... 358/160 |
| 4,523,232 | 6/1985 | Kameda et al. .................... 358/236 |
| 4,558,348 | 12/1985 | Bolger et al. .................. 358/21 R X |

Primary Examiner—James J. Groody
Assistant Examiner—E. Anne Toth
Attorney, Agent, or Firm—Frishauf, Holtz, Goodman & Woodward

[57] ABSTRACT

A television video signal A/D converter apparatus has an A/D converter which samples a television video signal to A/D convert it in accordance with upper and lower reference potentials, and supplies the digital signals to a liquid crystal display device. The apparatus also has detectors which detect digital values of the digital signals from the A/D converter which exceed a predetermined value and are below another predetermined value, and which respectively correspond to the upper and lower reference potentials for A/D conversion by the A/D converter. The digital values exceeding and below the predetermined values are counted by a counter, and the upper and lower reference potentials are determined in accordance with the respective counts and are supplied to the A/D converter.

13 Claims, 12 Drawing Figures

TELEVISION VIDEO SIGNAL A/D CONVERTER

BACKGROUND OF THE INVENTION

The present invention relates to a television video signal A/D converter apparatus in a television receiver having a liquid crystal display device.

Recently, liquid crystal television receivers, which use a liquid crystal display panel instead of a cathode-ray tube, have been developed and made known to the public as small, portable television sets. It is generally agreed that the brightness of the image displayed on the liquid crystal display panel can be adequately controlled in 16 gradations.

For providing these 16 different gradations, respective gradation signals are applied to a predetermined electrode provided in the liquid crystal display panel. The gradation signals are obtained by sampling the television video signal, for example, 160 times in a predetermined sampling gate time, and obtaining n-bit, for instance, 4-bit, code signals through analog-to-digital conversion of the sample signal. If 16 4-bit code signals of "0000" to "1111" are obtainable, the brightness can be controlled in 16 gradations between the two extremities.

In the meantime, the television video signal must be brightness-controlled in 16 gradations from the upper reference potential corresponding to a white level to the lower reference potential corresponding to a black level. The level of the actual television video signal, however, varies only in the range toward the upper reference potential when the image is very bright or in the range toward the lower reference potential when the image is very dark. Therefore, of the 16 gradations that are available for image control, only about 10 gradations, for example, are truly effective, so that the range of contrast control is narrowed to that extent.

Moreover, to increase the number of gradations to 32, 64, etc. thereby to improve contrast, an increased number of comparators must be provided in the analog-to-digital converter. This complicates the construction and increases the cost.

SUMMARY OF THE INVENTION

It is an object of the present invention to provide a television video signal A/D converter apparatus which is free from the drawbacks of the conventional apparatuses and which can provide clear gradations near white and black levels.

In order to achieve the above object of the present invention, there is provided a television video signal A/D converter apparatus comprising: A/D converting means for sampling a television video signal, A/D converting the sampled television video signal in accordance with upper and lower reference potentials, and supplying the A/D converted television video signal to a liquid crystal display device; detecting means connected to said A/D converting means for detecting a digital value exceeding a predetermined value corresponding to the upper reference potential supplied for A/D conversion and a digital value below a predetermined value corresponding to the lower reference potential also supplied for A/D conversion; counting means for counting within at least one field the digital value exceeding the predetermined value and the digital value below the predetermined value which are detected by the detecting means; and reference potential producing means for determining the upper and lower reference potentials in accordance with counts of the counting means and for supplying the upper and lower reference potentials to the A/D converting means. With the apparatus of the above configuration, the upper and lower reference potentials to be supplied to the A/D converter can be separately set in accordance with the sampling clock numbers which correspond to black and white levels of the digital video signal. Therefore, an excellent image contrast can be obtained, and clear gradations can be obtained near the black and white levels.

BRIEF DESCRIPTION OF THE DRAWINGS

FIGS. 4(A) to 4(I) are timing charts for explaining the operation of the block circuit diagram shown in FIG. 1;

FIGS. 8(A) to 8(D) and FIG. 9 are timing charts for explaining the mode of operation of the circuit shown in FIG. 7;

DETAILED DESCRIPTION OF THE PREFERRED EMBODIMENTS

The preferred embodiment of the present invention will be described with reference to the accompanying drawings.

Figure 1:
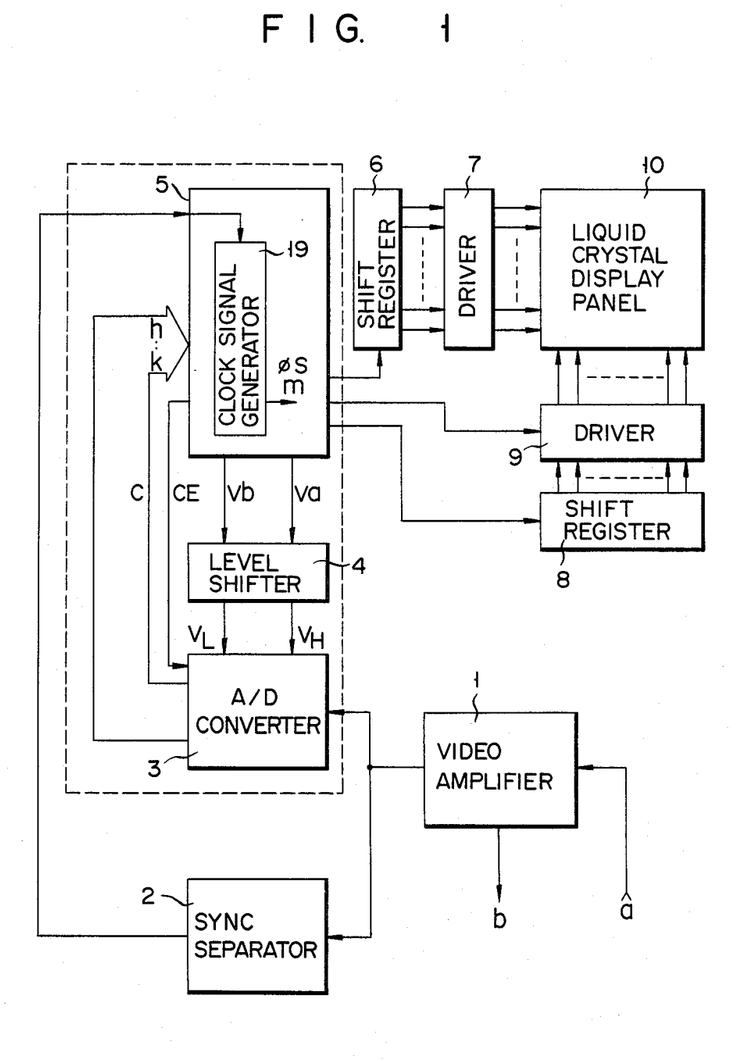
FIG. 1 is a block circuit diagram showing the overall configuration of an apparatus according to an embodiment of the present invention.

Referring to FIG. 1, a video signal amplifier 1 amplifies a video signal a supplied from a video detector (not shown) and supplies an amplified signal to a sync separator 2 and an A/D converter 3 and also supplies an audio signal b to an audio circuit (not shown). The A/D converter 3 receives a chip enable signal CE from a control circuit 5 and upper and lower reference potentials VH and VL obtained by level shifting control potentials Va and Vb from the control circuit 5 by a level shifter 4. The A/D converter 3 converts the video signal a into a 4-bit (h, i, j, k) digital signal c in accordance with the upper and lower reference potentials VH and VL and supplies the converted digital signal to the control circuit 5. The sync separator 2 separates horizontal and vertical sync signals from the input video signal a and supplies the separated horizontal and vertical sync signals to the control circuit 5. The control circuit 5 performs display control in accordance with the input signals from the A/D converter 3 and the sync separator 2. The control circuit 5 supplies common data and shift clocks to a first driver 7 through a shift register 6, and also supplies segment data and shift clocks to a shift register 8 and a second driver 9. A liquid crystal display panel 10 is driven in accordance with outputs from the first and second drivers 7 and 9. The liquid crystal display panel 10 has a 120×160 dot matrix. As will be described in detail later, the control circuit 5 counts sampling clocks of black and white levels of the television video signal and supplies the control potentials Va and Vb determined by the sampled clock numbers to the level shifter 4. The level shifter 4 sets the upper and lower reference potentials VH and VL in accordance with the control potentials Va and Vb and supplies them to the A/D converter 3.

Figure 2:
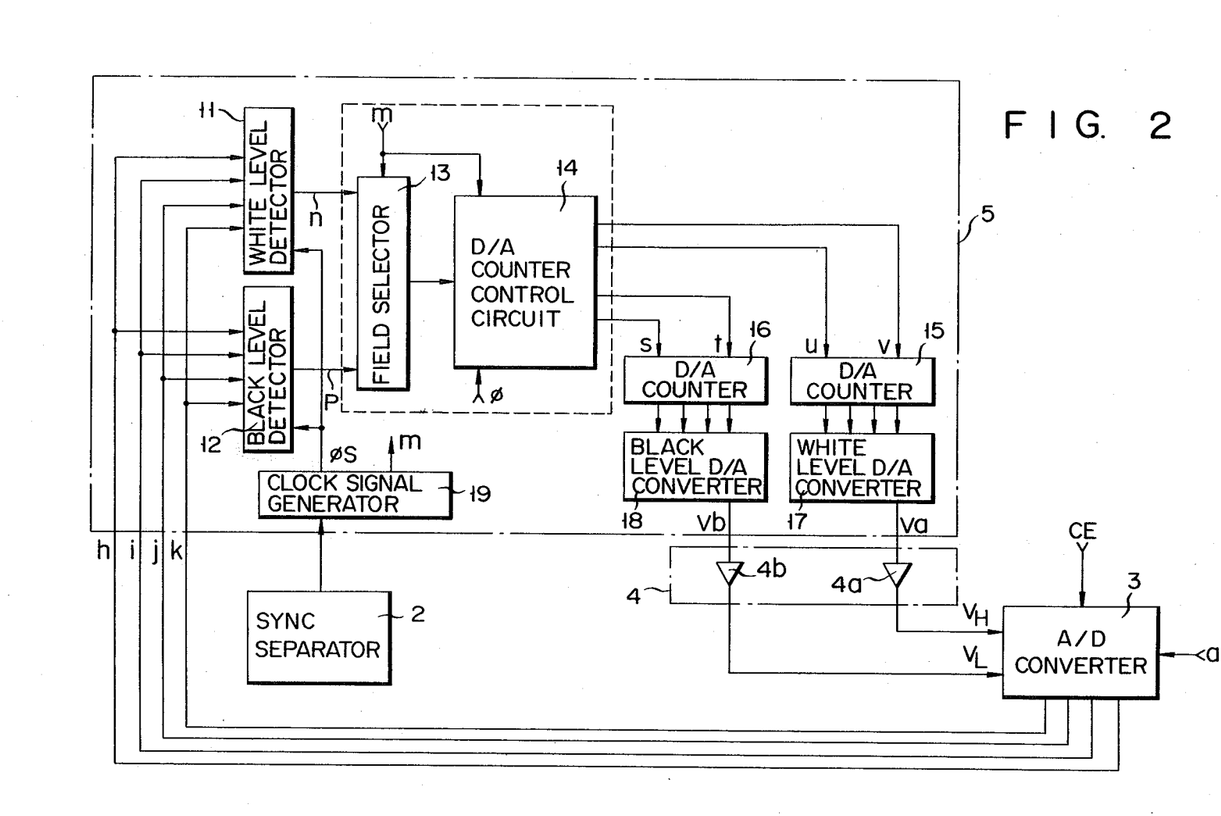
FIG. 2 is a circuit diagram showing the configuration of a control circuit 5 and a level shifter 4 shown in FIG. 1.

Further details of the control circuit 5 will be described with reference to FIG. 2. 4-bit television video signals h to k from the A/D converter 3 are supplied to a white level detector 11 and a black level detector 12. The detectors 11 and 12 receive 3.12 MHz sampling clocks $\phi s$ from a clock signal generator 19. The sampling clocks $\phi s$ are generated in an effective video signal period excluding the horizontal and vertical sync signals. When a television video signal higher than the upper reference potential VH is supplied, the detector 11 supplies the sampling clock $\phi s$ to a field selector 13 as a white level sampling clock n. When a television video signal lower than the lower reference potential VL is supplied, the detector 12 supplies the sampling clock p to a field selector 13 as a black level sampling clock p. In response to a field selection signal m from the clock signal generator 19, the selector 13 selects an output from the detector 11 or 12 and supplies a selected signal to a D/A counter control circuit 14. The field selection signal m is inverted between levels "1" and "0" every time the horizontal and vertical sync signals are supplied to the clock signal generator 19 from the sync separator 2. The signal m is supplied to the field selector 13 and also to the D/A counter control circuit 14. The control circuit 14 has a level counter 21 comprising a 12-bit binary counter. The counter 21 alternately counts the white or black level sampling clock n or p supplied through the selector 13 in accordance with the field selection signal m. The level counter 21 can count up to, for example, 2,000 or more and supplies for each field counter clocks u and s and count up/-down selection signals v and t to a white level D/A counter 15 and a black level D/A converter 16 for each field in accordance with its own count. When the white level is counted, if the count in a given field is 2,000 or more, a count-up command is supplied to the white D/A counter 15. If the count is less than 1,000, a count-down command is supplied to the counter 15. When the black level is counted, if the count in a given field is 2,000 or more, a count-down command is supplied to the black level D/A counter 16. If the count is less than 1,000, a count-up command is supplied to the counter 16. The counts of the counters 15 and 16 are D/A converted by white and black level D/A converters 17 and 18, respectively, and the obtained digital signals are supplied to the level shifter 4. The level shifter 4 consists of upper and lower reference potential level shifters 4a and 4b. The shifters 4a and 4b shift the outputs from the converters 17 and 18, respectively, and supply the obtained upper and lower reference potentials VH and VL to the A/D converter 3.

Figure 3:
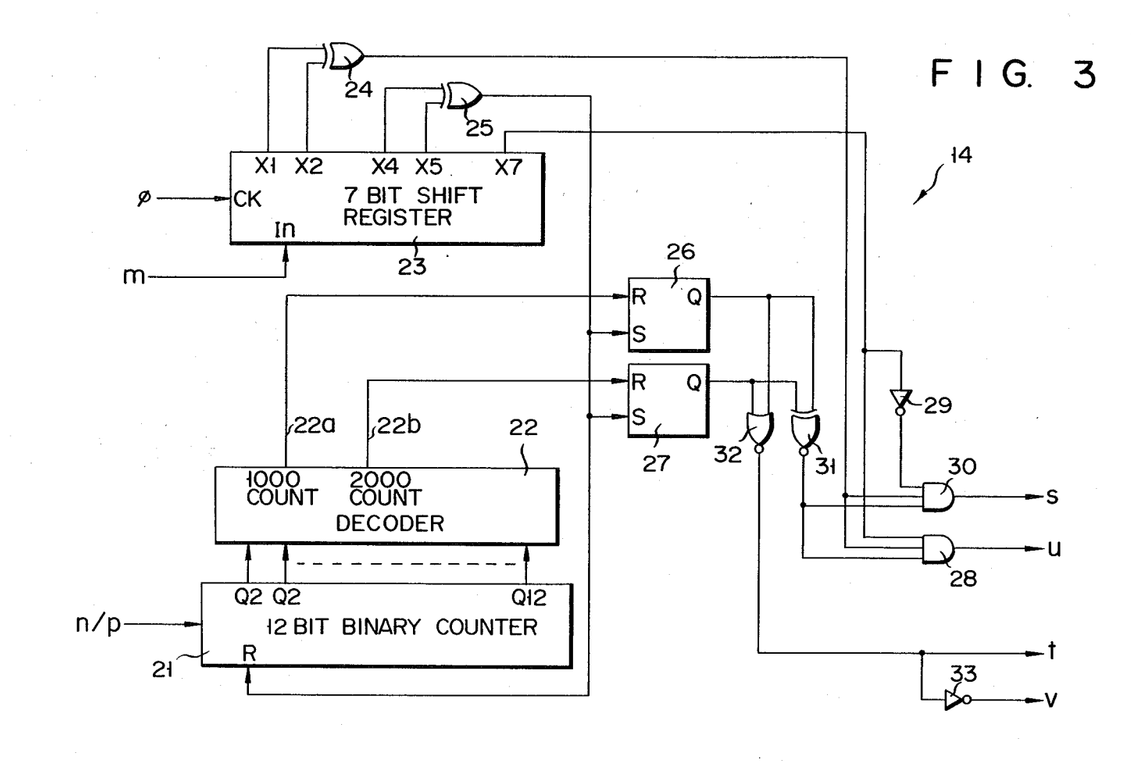
FIG. 3 is a circuit diagram showing the configuration of a D/A converter control circuit shown in FIG. 1.

The D/A counter control circuit 14 has a configuration as shown in FIG. 3. Referring to FIG. 3, reference numeral 21 denotes the level counter comprising, for example, a 12-bit binary counter and counting clocks n or p supplied from the field selector 13. A decoder 22 decodes the count of the level counter 21. When the counted value is 1,000 or more, the decoder 22 generates a signal from an output line 22a. When the counted value is 2,000 or more, the decoder 22 generates a signal from an output line 22b. Reference numeral 23 denotes a 7-bit shift register and performs timing control of the circuit in accordance with internal fundamental clocks $\phi$. The shift register 23 shifts the field selection signal m and supplies the outputs upon the first and second shift operations to an EX-OR gate (Exclusive-OR gate) 24. The first output from the EX-OR gate 24 is supplied to AND gates 28 and 30 so as to prepare a field selection pulse s or u. The outputs from the shift register 23 upon the fourth and fifth shift operations are supplied to an EX-OR gate 25, an output from which is used to set flip-flops 26 and 27 and reset the level counter 21. The output from the shift register 23 upon the seventh shift operation is supplied to an AND gate 28, while it is supplied to an AND gate 30 through an inverter 29, thereby determining which one of the pulse signals s and u is to be produced for field selection. Outputs from the flip-flops 26 and 27 are supplied to the AND gates 28 and 30 through an EX-NOR gate 31 so as to perform output control of the pulses s and u. Outputs from the flip-flops 26 and 27 are supplied to a NOR gate 32, an output from which is extracted directly or through an inverter 33, thereby obtaining a signal t or v commanding a count-up or count-down operation in accordance with the output from the decoder 22. More specifically, in the white field (m="High"), when the count of the level counter 21 comprising a 12-bit binary counter does not exceed 1,000, t=0 and v=1. Thus, a down-count operation of the D/A counter 15 is commanded. Since both the flip-flops 26 and 27 are set, an output from the EX-NOR gate 31 is "1" and a signal u is produced from the AND gate 28. Therefore, the counter 15 counts down.

In the white field, if the count of the level counter 21 falls within the range between 1,000 (inclusive) and 2,000 (exclusive), t=0, v=1 and the output from the EX-NOR gate 31=0. Therefore, neither of the signals s and u are produced.

In the white field, if the count of the level counter 21 is 2,000 or more, t=1 and v=0, providing a count-up command to the counter 15. An output from the EX-NOR gate 31 becomes "1", and the counter 15 counts up. In the black field, a similar operation is performed except that the signals t/v and s/u are changed.

The mode of operation of the overall circuit of the first embodiment will be described with reference to the timing chart shown in FIGS. 4(A) to 4(I). Referring to FIG. 1, the amplifier 1 amplifies the television video signal a shown in FIG. 4(A) supplied from the video detector, and supplies the amplified signal to the sync separator 2 and the A/D converter 3. The amplifier 1 also supplies the audio signal b to the audio circuit. In FIG. 1, a horizontal sync signal is not shown. The sync separator 2 separates the horizontal and vertical sync signals from the television video signal, and supplies them to the control circuit 5. The A/D converter 3 converts the video signal into 4-bit (h, i, j, k) digital data c in accordance with the upper and lower reference potentials VH and VL supplied from the level shifter 4, and supplies the obtained data c to the control circuit 5. In synchronism with the vertical sync signal, the control circuit 5 supplies a vertical scanning timing signal to the shift register 6 and a digital video signal to the shift register 8. The shift register 6 sequentially shifts the data supplied from the control circuit 5 in accordance with a predetermined timing signal. The first driver 7 vertically scans the liquid crystal display panel 10 in accordance with the shift operation of shift register 6. Data held in the shift register 8 is supplied to the second driver 9 in synchronism with a timing signal from the control circuit 5. The second driver 9 horizontally drives the liquid crystal display panel 10.

Figure 4:
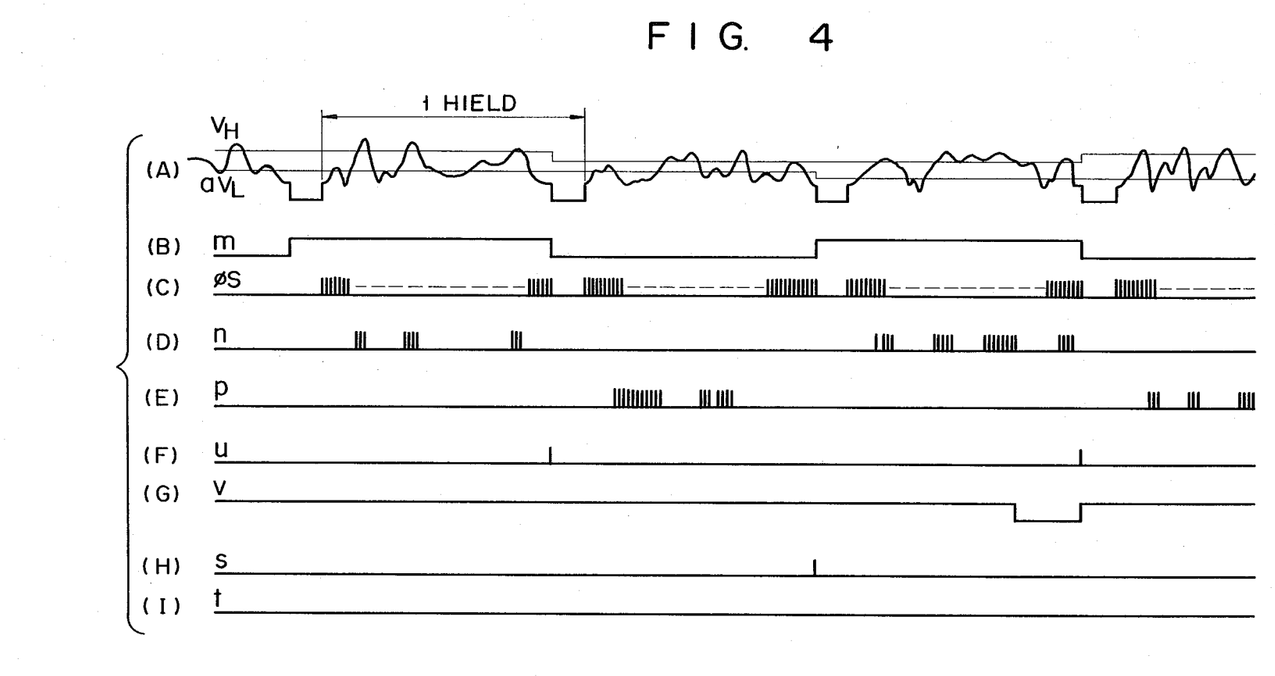

In response to the video signal a from the A/D converter 3, the white level detector 11 detects a video signal exceeding the upper reference potential VH. Upon detection of such a video signal, the detector 11 generates a white level sampling clock n as shown in FIG. 4(D). Upon detection of a television video signal lower than the lower reference potential VL, the black level detector 12 produces a black level sampling clock p. The clock n or p is alternately selected for each field by the field selector 13, and the selected clock n or p is supplied to the control circuit 14. As shown in FIG. 4(B), when the field selection signal m is at a high level, the control circuit 14 counts the white level sampling clock n. When the signal m is at a low level, the control circuit 14 counts the clock p. The control circuit 5 generates control signals (v, t, u, s) in accordance with the counts of the signals n and p when the signal m is switched. When the signal m is switched from a low level to a high level, the selector 13 is switched to connect to the side of the detector 11. At the same time, the level counter 21 of the D/A counter control circuit 14 is cleared, and the white level sampling clock n is counted by the level counter 21. When the count of the level counter 21 is less than 1,000 upon counting for one field, the signal v from the control circuit 14 is kept at level "1" and a count-down command is supplied to the counter 15. The counter clock u is generated from the control circuit 14, and the counter 15 counts down. When many white level components are included in the television video signal and the count of the level counter 21 is 2,000 or more, the selection signal v goes to level "0", and the counter clock u is supplied from the control circuit 14 to the white level D/A counter 15. Then, the counter 15 counts up. The count output from the counter 15 is converted into an analog signal by the converter 17, level-shifted by the level shifter 4a of the level shifter 4, and is supplied to the A/D converter 3 as the upper reference potential VH. When the field selection signal m goes to a low level, the selector 13 is switched to the side of the detector 12. At the same time, the level counter in the control circuit 14 is cleared, and the counting operation of the black level sampling clock p is started. In this case, if the video signal contains many black components and the count exceeds 2,000 at a field end, the selection signal t from the control circuit 14 is held at "1" and a count-down command is supplied to the black level D/A counter 16. At this time, the counter clock s is supplied from the control circuit 14, and the counter 16 counts down. If the television video signal contains fewer black level components and the count is less than 1,000 at the field end, the signal t goes to level "0", and the counter clock s is supplied from the control circuit 14 to the counter 16. Then, the counter 16 counts up. A count output from the counter 16 is converted into an analog signal by the D/A converter 18, level-shifted by the lower reference potential level shifter 4b of the level shifter 4, and is supplied to the A/D converter 3 as the lower reference potential VL. The A/D converter 3 performs A/D conversion in accordance with the upper and lower reference potentials VH and VL. In this case, if the counts of the white or black level sampling clocks n and p fall within a predetermined range, the upper and lower reference potentials VH and VL are not changed. However, if the counts of the clocks n and p fall outside the predetermined range, the upper and lower reference potentials VH and VL are increased or decreased. Therefore, when the lower limit of the upper reference potential is represented by A1 and the upper limit thereof is represented by A2, if the values A1 and A2 are increased, a sharp contrast is obtained. If the values A1 and A2 are decreased, a less sharp contrast is obtained.

Figure 5:
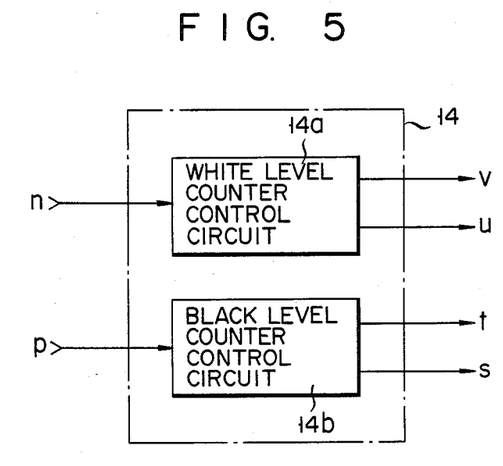
FIG. 5 is a block circuit diagram showing another embodiment of the D/A converter control circuit shown in FIG. 1.

A second embodiment of the present invention will be described with reference to FIG. 5. In the first embodiment, as shown in FIG. 2, the field selector 13 is used to switch between the white or black level detector 11 or 12 so as to use the level counter 21 inside the D/A counter control circuit 14 commonly for counting the white and black level sampling clocks. However, in the second embodiment, as shown in FIG. 5, white and black level counter control circuits 14a and 14b are separately included in the D/A counter control circuit 14. With this configuration, the setting control of the upper and lower reference potentials VH and VL can be simultaneously performed by counting the white and black level sampling clocks n and p for each field.

In the first embodiment, when the counts of the white and black level sampling clocks exceed 2,000 and fall below 1,000, the upper and lower reference potentials VH and VL are changed. However, the present invention is not limited to this particular arrangement, and the counts for setting different values of the upper and lower reference potentials can be variously set.

Another embodiment of a television video signal A/D converter apparatus capable of properly responding to an abrupt change in an input television video signal and of providing stable reference signals will be described with reference to FIGS. 6 to 10.

Figure 6:
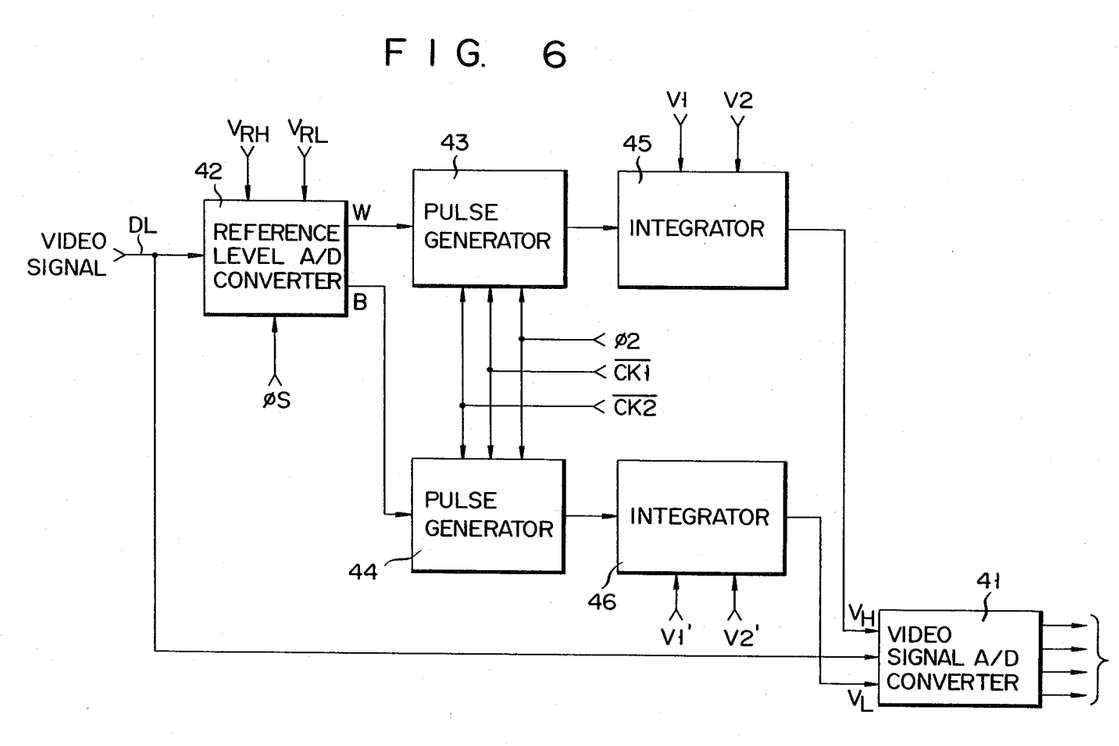
FIG. 6 is a block circuit diagram showing the overall configuration of an apparatus according to another embodiment of the present invention.

The schematic configuration of the apparatus of the third embodiment will be described with reference to FIG. 6. A television video signal supplied through a signal line DL is supplied to a television video signal A/D converter 41 and to a reference level A/D converter 42. The reference level A/D converter 42 receives upper and lower reference potentials VRH and VRL preset by a control section (not shown), and 3.12 MHz sampling clocks $\phi s$ from a clock signal generator (not shown). The A/D converter 42 compares the television video signal with the upper and lower reference potentials VRH and VRL. When the television video signal exceeds the potential VRH, the A/D converter 42 determines a white level and produces a white data digital signal W synchronous with the sampling clock $\phi s$. If the television video signal is below the potential VRL, the A/D converter 42 determines a black level and produces a black digital signal B. The signal W from the A/D converter 42 is supplied to a pulse generator 43, while the signal B therefrom is supplied to a pulse generator 44. The pulse generators 43 and 44 also receive clock pulses $\phi 2$, $\overline{CK1}$, and $\overline{CK2}$ from the control section. About 50,000 clock pulses $\phi 2$ are generated within one field interval, the clock pulse $\overline{CK2}$ is produced for each field, and the clock pulse $\overline{CK1}$ is generated at a time delayed from the clock pulse $\overline{CK2}$ by an interval of several horizontal periods H. Outputs from the pulse generators 43 and 44 are supplied to integrators 45 and 46, respectively. Operating voltages V1 and V2 are respectively supplied to the integrator 45, and operating voltages V1' and V2' are supplied to the integrator 46. In response to the signal from the pulse generator 43, the integrator 45 integrates the voltage V1 or V2 and supplies an integral output to the video signal A/D converter 41 as the upper reference potential VH. In response to the signal from the pulse generator 44, the integrator 46 integrates the voltage V1' or V2' and supplies an integral output to the A/D converter 41 as the lower reference potential VL. In accordance with the upper and lower reference potentials VH and VL supplied from the integrators 45 and 46, the A/D converter 41 converts the television video signal from the amplifier into a 4-bit digital signal and supplies it to a liquid crystal display device (not shown) comprising a liquid crystal display panel.

Figure 7:
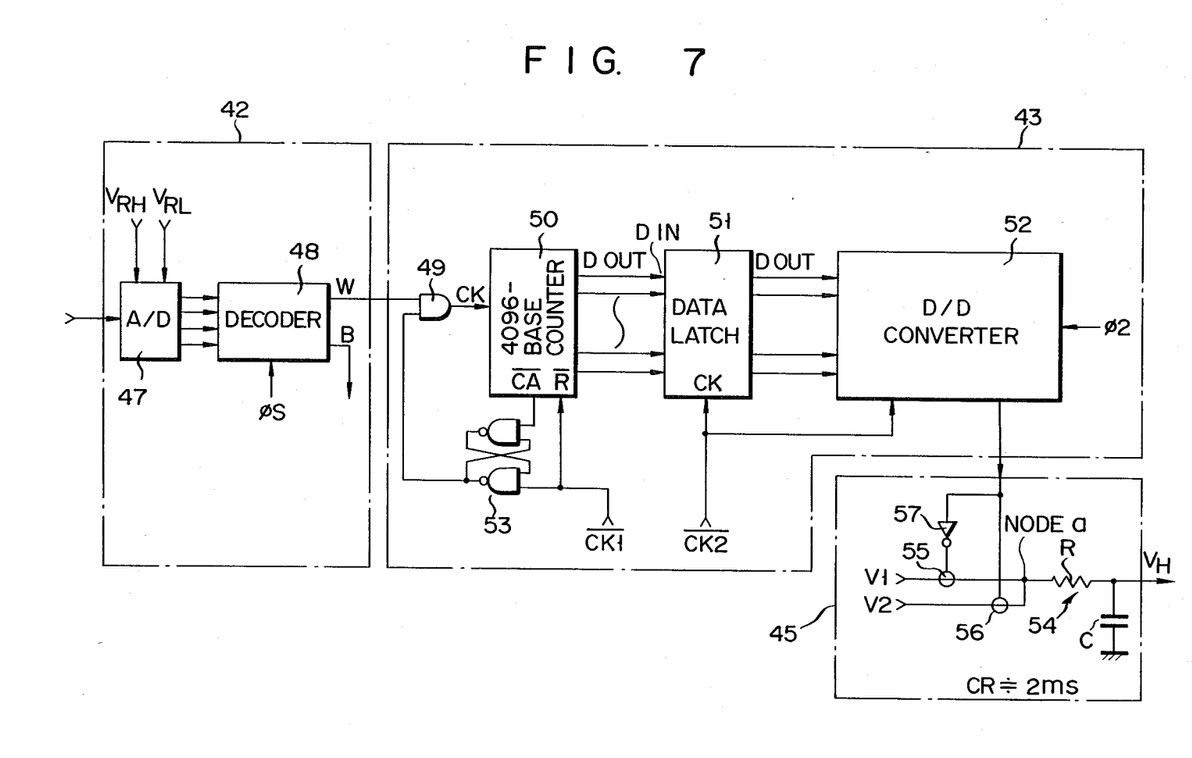
FIG. 7 is a block circuit diagram of a reference level A/D converter 42 and a pulse generator 43 shown in FIG. 6.
Figure 8:
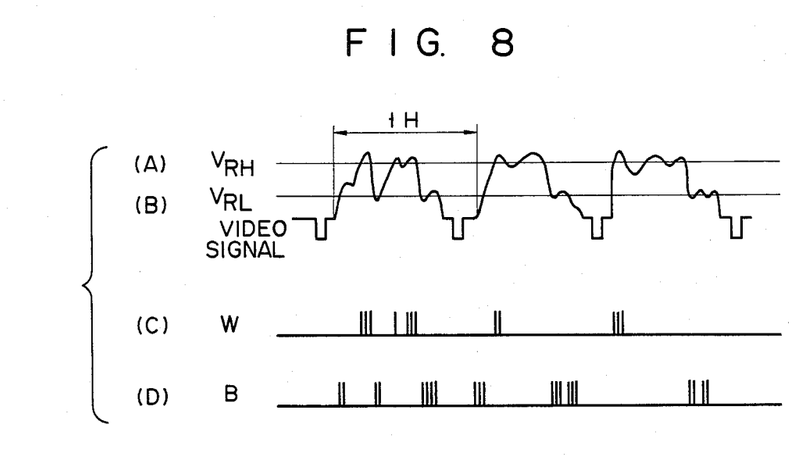

Details of the A/D converter 42, the pulse generator 43, and the integrator 45 will be described with reference to FIG. 7. The reference level A/D converter 42 comprises an A/D converter 47 and a decoder 48. The A/D converter 47 receives the amplified television video signal from the amplifier and the upper and lower reference potentials VRH and VRL. The A/D converter 47 converts a white level signal exceeding the upper reference potential VRH into a 4-bit digital signal "1111" and a black level signal lower than the lower reference potential VRL into a 4-bit digital signal "0000". An output signal from the A/D converter 47 is decoded by the decoder 48 in synchronism with the sampling clock s and is produced as a white or black level signal W or B. The signal W is supplied to the pulse generator 43, while the signal B is supplied to the pulse generator 44.

The pulse generator 43 comprises an AND gate 49, a counter 50 of, for example, 4096 base, a data latch 51, a D/D converter 52, and a latch 53. The signal W from the A/D converter 42 is supplied to the clock input terminal of the counter 50 through the AND gate 49. The AND gate 49 receives the latch output from the latch 53. The latch 53 latches an input signal in response to the clock pulse $\overline{CK1}$, and is reset in response to a carry signal from the counter 50. The clock pulse $\overline{CK1}$ is supplied to a reset terminal $\overline{R}$ of the counter 50. A count output from the counter 50 is latched by the data latch 51 in response to the clock pulse $\overline{CK2}$ and is supplied to the D/D converter 52. The D/D converter 52 performs D/D conversion of the data from the data latch 51 in response to the clock pulse $\overline{CK2}$, and supplies a conversion output to the integrator 45.

The integrator 45 comprises a time constant circuit 54 consisting of an integrating resistor R and an integrating capacitor C, a gate circuit 55 for supplying an operating voltage V1 to the circuit 54, and a gate circuit 56 for supplying an operating voltage V2 thereto. An output signal from the D/D converter 52 is directly supplied to the gate terminal of the gate circuit 56 and to the gate terminal of the gate circuit 55 through an inverter 57. The time constant of the circuit 54 is set about 2 ms, and an output from the circuit 54 is supplied to the A/D converter 47 as the upper reference potential VH.

The pulse generator 44 and the integrator 46 for processing the black level signal have similar arrangements to those of the pulse generator 43 and the integrator 45, and a description of details thereof will be omitted.

The mode of operation of this embodiment will be described with reference to the timing charts shown in FIGS. 8(A) to 8(D) and FIG. 9. In this embodiment, the liquid crystal display panel has $120 \times 160 = 19200$ dots, and in this panel, ideal numbers of black and white dots are respectively 2300. When a video signal in FIG. 8(B) is supplied from the amplifier to the A/D converter 42, it compares the input video signal with the upper and lower reference potentials VRH and VRL. When the video signal is a white level signal exceeding the upper reference potential VRH, the A/D converter 47 generates a 4-bit "1111" output. When the television video signal is a black signal lower than the lower reference potential VRL, the A/D converter 47 generates a 4-bit "0000" signal. The white or black level digital signal from the A/D converter 47 is decoded by the decoder 48, and the decoded signal is produced as the signal W or B, as shown in FIGS. 8(C) or 8(D). The white level signal W from the decoder 48 is supplied to the pulse generator 43, while the black signal $\overline{W}$ is supplied to the pulse generator 44.

Figure 9:
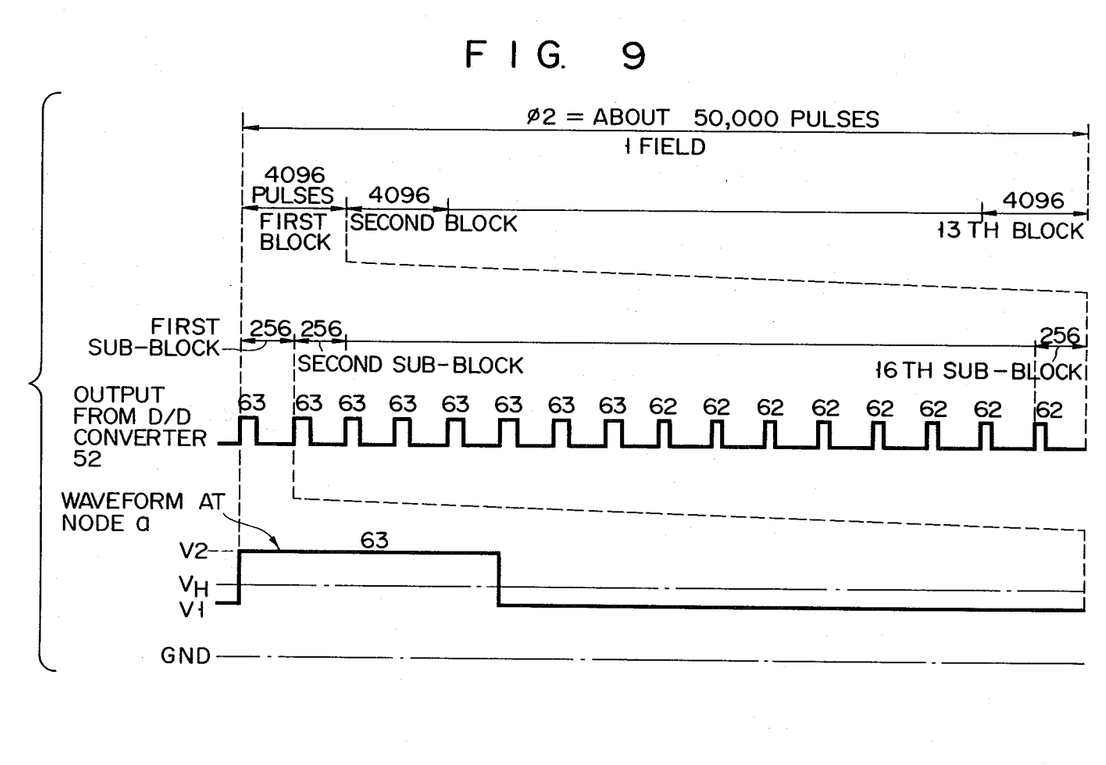

In response to the clock pulse $\overline{CK1}$, the counter 50 of the pulse generator 43 is reset and the pulse $\overline{CK1}$ is latched in the latch 53. Then, the output from the latch 53 goes to level "1" and the gate of the AND gate 49 is enabled. The white level signal W from the decoder 48 is supplied to the counter 50 through the AND gate 49, and the count-up operation of the counter 50 is started. The counter 50 counts the white level signal W supplied from the decoder 48 for a period of one field. The count of the counter 50 is latched in the data latch 51 in synchronism with the clock pulse $\overline{CK2}$, and is supplied to the D/D converter 52. In this case, if more than 4,096 signals are supplied from the decoder 48 to the counter 50, a carry signal is supplied from the counter 50 to reset the latch 53. The gate of the AND gate 49 is thus disabled, and any further input thereto is inhibited. The D/D converter 52 performs the D/D conversion shown in FIG. 9 in accordance with the contents of the data latch 51. FIG. 9 shows the operation of the data latch 51 when a count "1,000" of the counter 50 is latched therein. The D/D converter 52 is reset by the clock pulse $\phi 2$ for each field. Each field is equally divided into 13 blocks from the first to thirteenth blocks. The time duration of each block is determined by counting 4,096 clock pulses $\phi 2$. Each of the first to 13th blocks is further equally divided into first to 16th sub-blocks. Each sub-block corresponds to 256 clock pulses $\phi 2$. In the first to 16th sub-blocks, the D/D converter 52 generates pulse signals of the duration corresponding to the latch data in the data latch 53. For example, when the count "1,000" is latched in the data latch 51, the D/D converter 52 generates a pulse signal having a duration corresponding to 63 clock pulses $\phi 2$ for each of the first to eighth sub-blocks and generates a pulse signal having a duration corresponding to 62 clock pulses for each of the ninth to 16th sub-blocks. In this manner, the time duration corresponding to the count "1,000" is equally divided into the first to 16th sub-blocks. The signals of the first to 16th sub-blocks are supplied to the integrator 45 as an output from the D/D converter 52.

While a signal of high level is supplied from the D/D converter 52 for each of the first to 16th sub-blocks, the gate of the gate circuit 56 in the integrator 45 is enabled and the voltage V2 is supplied to the time constant circuit 54. However, while a signal of low level is supplied, an output from the inverter 57 enables the gate of the gate circuit 55 and the voltage V1 is produced from the time constant circuit 54. The circuit 54 integrates the voltage V2 or V1 supplied to the input point a through the gate circuit 56 or 55, and supplies the integrated voltage to the A/D converter 41 as the upper reference potential VH. The voltage V1 is the lower limit of the white signal of the video signal, and the voltage V2 is the upper limit thereof. When the latch data in the data latch 51 in the pulse generator 43 is "0", an output from the D/D converter 52 is kept at level "0". Therefore, an output from the gate circuit 55 is set at "1", so that the gate of the gate circuit 55 is enabled and the voltage V1 is produced as the upper reference potential VH. When the latch data of the data latch 51 is "4,096", an output from the D/D converter 52 is kept at a high level. Therefore, the gate of the gate circuit 56 is enabled and the voltage V2 is produced as the upper reference voltage VH. In this manner, every time the latch data of the data latch 51 is decremented by 1, the output from the integrator 45 is decreased by "|V2-V1|/4096". When the latch data of the data latch 51 is "2,300", the upper reference voltage VH produced from the integrator 45 is at a level intermediate between the voltages V1 and V2.

Processing similar to the processing of the white level signal W is performed in the pulse generator 44 and the integrator 46 for processing the black level signal B produced from the A/D converter 42. The lower reference potential VL is produced from the integrator 46 and is supplied to the video signal A/D converter 41.

The A/D converter 41 converts the signal supplied from the amplifier into 200 4-bit digital signals in accordance with the upper and lower reference potentials VH and VL, and supplies the digital signals to the liquid crystal display panel.

When a video signal corresponding to a normal image is supplied from the amplifier, a best image quality is obtained when the number of white and black level signals W and B produced by the A/D converter 42 in one field, i.e., the number of "1111" and "0000" is about 2,300. In accordance with the white and black level signals W and B from the A/D converter 42, the pulse generators 43 and 44 generate pulse signals in the manner described above. The integrators 45 and 46 generate the upper and lower reference potentials VH and VL in accordance with these pulse signals. The A/D converter 41 performs A/D conversion in accordance with the voltages VH and VL. The respective circuits are adjusted so that in the case of a normal picture, about "2,300" white and black signals are obtained for one field.

When it is assumed that a sufficiently bright image is supplied as an input television video signal and the number of signals of "1111" generated from the A/D converter 42 is "2,300+n", the signal duration in the first to 16th sub-blocks from the D/D converter 52 of the pulse generator 43 is prolonged, and the upper reference potential VH produced from the integrator 45 is increased by "(|V1-V2|/4096) n" (V). With such an increase in the potential VH, the number of signals of "1111" from the A/D converter 41, i.e., the number of white level signals W is sufficiently close to "2,300" and a good picture is obtained. Similar processing is performed by the pulse generator 44 and the integrator 46 for the black level signals B.

When the liquid crystal display panel is used as described above, it is experimentally confirmed that the best image quality is obtained when completely white or black data is about 10 to 15% of the screen. The number of completely white or black data which results in a best image quality is calculated by arithmetic operations and is defined as X. It is determined that a good picture is obtained when the number of completely white or black data falls within the range of "X−a" to "X+a". When the total number of dots on the liquid crystal display panel is "120×160=19200", the ratio of the completely white or black data is 12% and a is 3%, we have:

$X \approx 120 \times 160 \times 0.12 \approx 2300$,
$X \approx 120 \times 160 \times 0.03 \approx 600$ When the completely white or black data falls within the range of "2300−600" to "2300+600", a good picture is obtained. Therefore, a good picture is always obtained by changing the upper and lower reference potentials VH and VL of the A/D converter 41 so that the number of completely white or black data on the screen is close to X.

Figure 10:
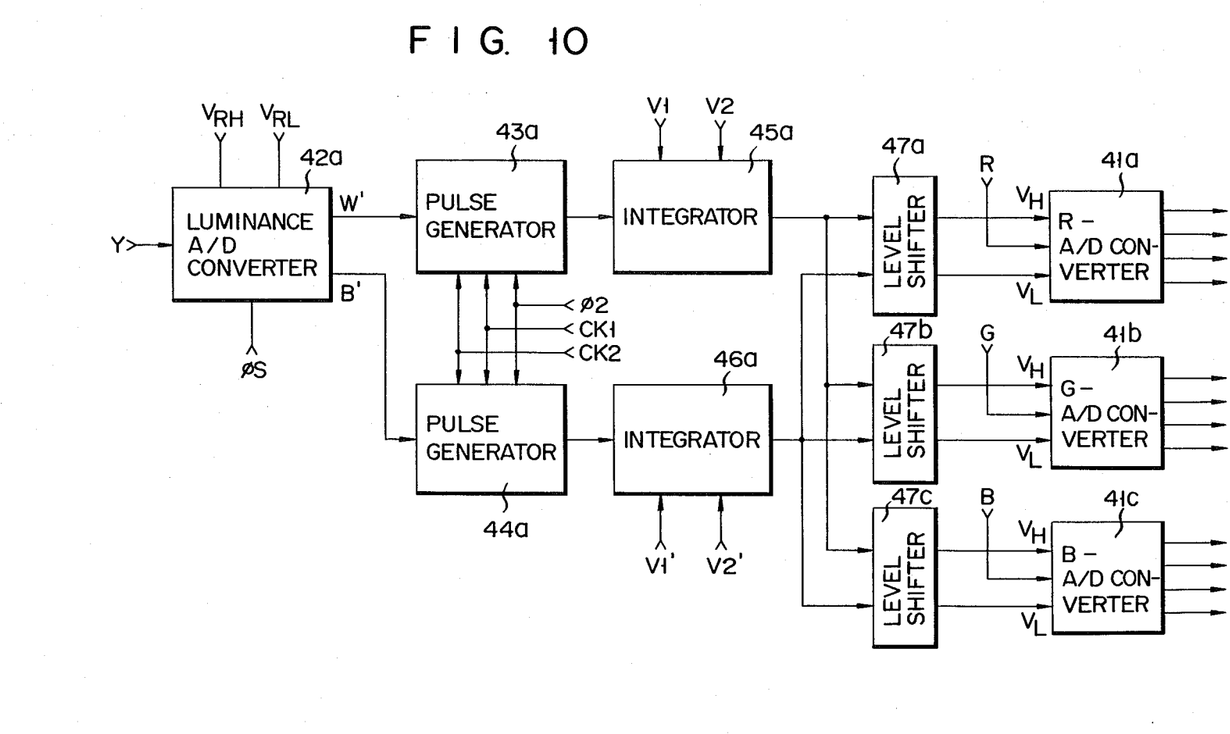
FIG. 10 is a block circuit diagram showing an apparatus according to still another embodiment of the present invention.

Still another embodiment of the present invention will be described with reference to FIG. 10. According to this embodiment, the present invention is applied to a color liquid crystal television receiver. Referring to FIG. 10, reference numeral 42a denotes a luminance A/D converter receiving a luminance signal Y from a video signal processing circuit (not shown). The A/D converter 42a also receives upper and lower reference voltages VRH and VRL preset by the control section, and also receives a sampling clock $\phi s$ from a clock signal generator (not shown). The A/D converter 42a detects levels of the luminance signal Y which exceed the upper or lower reference potential VRH or are below the lower reference potential VRL. The A/D converter 42a samples the signal Y in synchronism with the sampling clocks $\phi s$ and supplies signals W' and B' to pulse generators 43a and 44a. In response to the signals W' and B', the pulse generators 43a and 44a generate pulses in the same manner as in the first embodiment and supply them to integrators 45a and 46a. The integrators 45a and 46a integrate the received signals in accordance with pulses from the pulse generators 43a and 44a, and supply integral outputs to level shifters 47a, 47b and 47c. The level shifters 47a, 47b and 47c shift the levels of the outputs from the integrators 45a and 46a, and supply the shifted voltages to red, green and blue A/D converters 41a, 41b, and 41c as the upper and lower reference potentials VH and VL. Red, green and blue signals R, G and B are respectively supplied to these A/D converters 41a, 41b and 41c from a color signal processor (not shown). The converters 41a, 41b and 41c perform A/D conversion of the color signals R, G and B in accordance with the upper and lower reference potentials VH and VL supplied from the level shifters 47a, 47b and 47c, and supply the obtained digital signals to a liquid crystal display panel. When the present invention is applied to a color liquid crystal television receiver in this manner, processing for each of the color signals R, G and B is performed in accordance with the upper and lower reference potentials VH and VL in the manner as described above, and a similar effect to that described above is obtained.

In the embodiments described above, separate A/D converters are used and outputs therefrom are appropriately adjusted in accordance with a television video signal and are supplied to a video signal A/D converter as reference potentials. Therefore, a converter apparatus is obtained which can respond to abrupt changes in an input television video signal and stable reference potentials for the input television video signal are obtained.

Still other embodiments of the present invention will be described with reference to FIGS. 11 and 12. In these embodiments, an A/D converter for setting reference potentials is incorporated separately from an A/D converter for performing A/D conversion of a television video signal. The television video signal is A/D converted in accordance with reference potentials set by this special A/D converter, and the reference potentials thus set are fed back to the reference potential setting A/D converter. Thus, an A/D converter apparatus of this embodiment can perform A/D conversion with quick response to changes in luminance of a television video signal and can also adjust the levels of external reference potentials.

Figure 11:
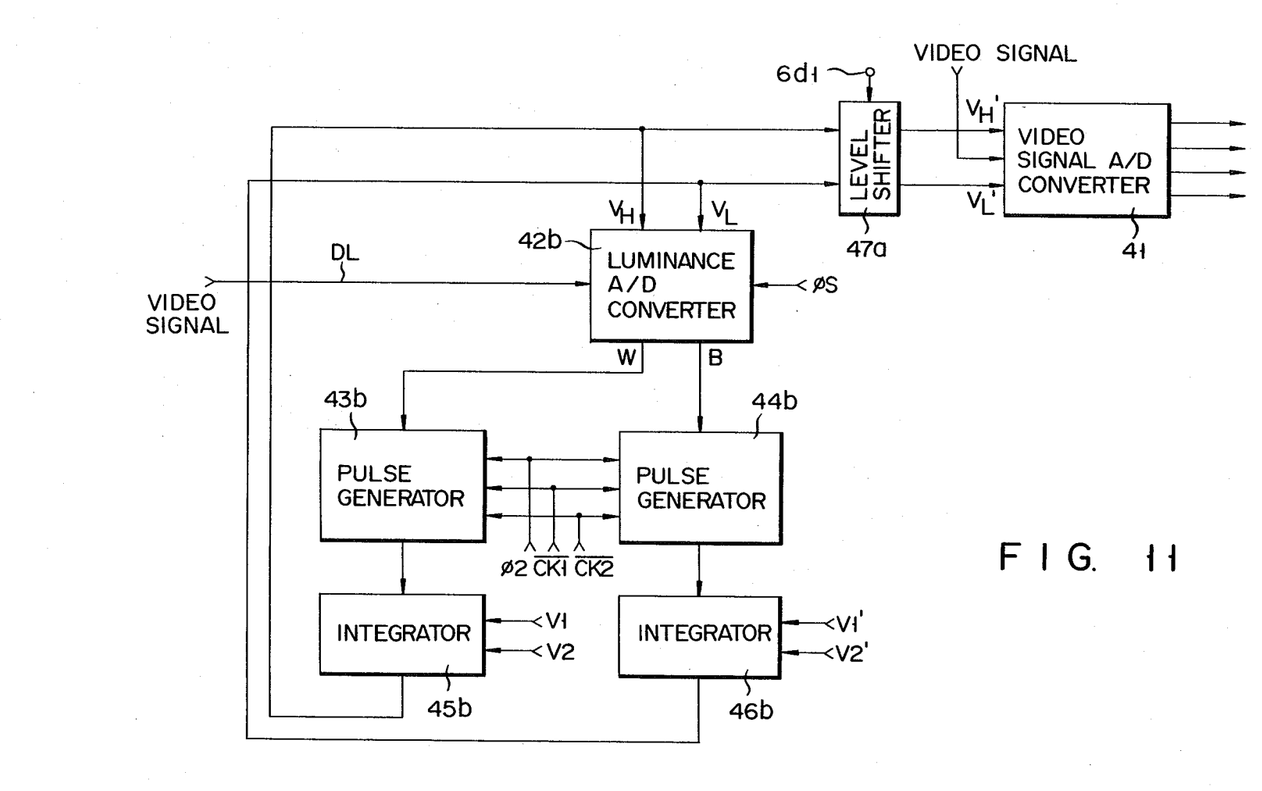
FIG. 11 is a block circuit diagram showing the overall configuration of an apparatus according to still another embodiment of the present invention.

FIG. 11 shows an embodiment wherein A/D conversion of a black-and-white television video signal is performed. Referring to FIG. 11, a black-and-white television video signal is supplied to a luminance A/D converter 42b through a signal line DL. The A/D converter 42b also receives upper and lower reference potentials VH and VL supplied from integrators 45b and 46b, and a 3.12 MHz sampling clock $\phi$s from a clock signal generator (not shown). The luminance A/D converter 42b compares the input black-and-white television video signal with the reference potentials VH and VL. The converter 42b detects levels of the television video signal which exceed the potential VH or are below the potential VL, and produce the detected levels as white and black television level signals W and B in synchronism with the sampling clock $\phi$s. The signal W is supplied to a pulse generator 43b, and the signal B is supplied to a pulse generator 44b. Clock pulses $\phi$2, $\overline{CK1}$ and $\overline{CK2}$ are supplied to both of the pulse generators 43b and 44b. About 50,000 clock pulses $\phi$2 are generated in one field period. The clock pulse $\overline{CK2}$ is generated for each field. The clock pulse $\overline{CK1}$ is generated with a delay time corresponding to several horizontal periods H from the clock pulse $\overline{CK2}$. Outputs from the pulse generators 43b and 44b are supplied to the integrators 45b and 46b, respectively. Operating voltages V1 and V2 are supplied to the integrator 45b, and operating voltages V1' and V2' are supplied to the integrator 46b. The integrator 45b integrates voltage V1 or V2, and supplies the integral value to the A/D converter 42b as the upper reference voltage VH. In response to a signal from the pulse generator 44b, the integrator 46b integrates the operating voltage V1' or V2', and feeds back the integral value to the A/D converter 42b as the lower reference potential VL. Outputs from the integrators 45b and 46b are supplied to a level shifter 47a and level-shifted outputs are supplied to a television video signal A/D converter 41 as upper and lower reference potentials VH' and VL' The reference brightness of the display can be adjusted by manually operating the potential supplied to an input terminal 6d1 of the level shifter 47a and thereby changing the output from the A/D converter 41. In this manner, according to this embodiment, since reference potentials can be externally supplied for A/D conversion of a television video signal, the reference potentials can be easily adjusted even if the overall circuit is formed into an LSI.

Furthermore, in this embodiment, a reference potential setting A/D converter is incorporated separately from an A/D converter for performing A/D conversion of a black-and-white television video signal, A/D conversion of the input television video signal is performed in accordance with the reference potentials set by the A/D converter, and the reference potentials set in this manner are fed back to the reference potential setting A/D converter. Therefore, A/D conversion can be performed correctly following changes in the luminance of the video signal, and optimal contrast can be obtained. An embodiment wherein a color television video signal is A/D converted will be described with reference to FIG. 12.

Figure 12:
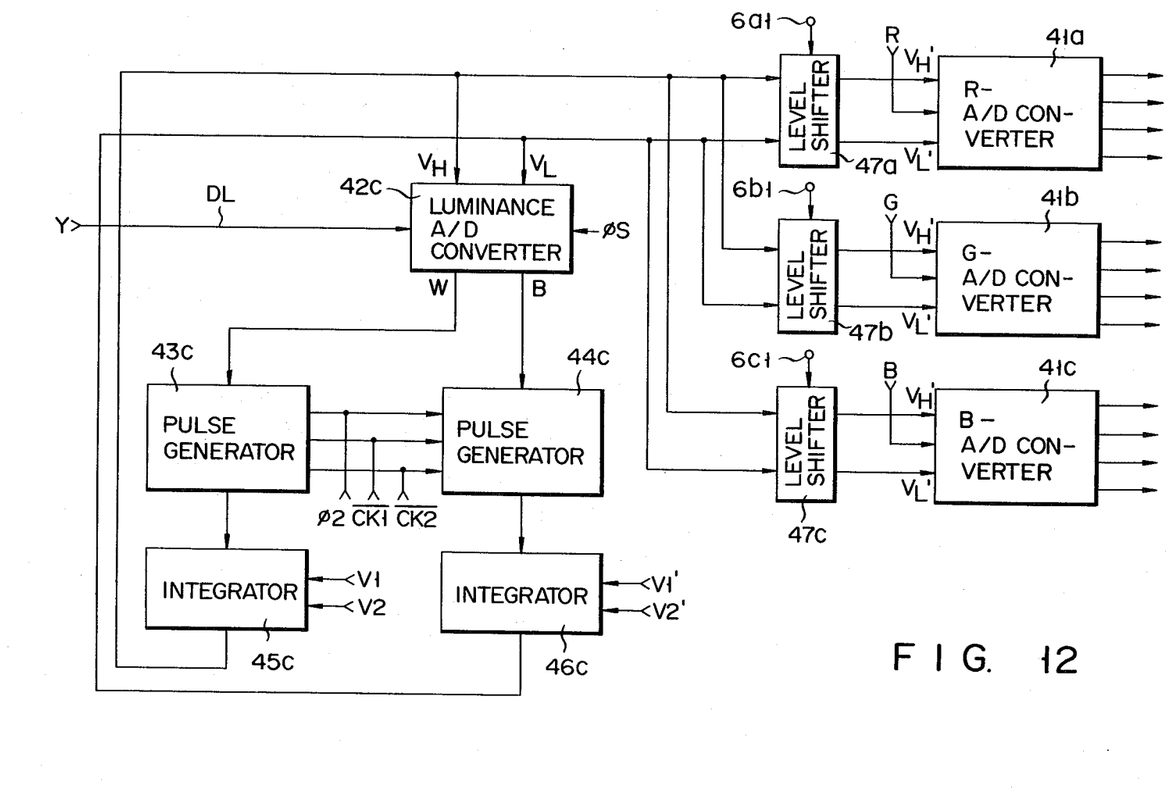
FIG. 12 is a block circuit diagram showing the overall configuration of an apparatus according to still another embodiment of the present invention.

Referring to FIG. 12, reference numeral 42c denotes a luminance A/D converter receiving an average video signal of R, G and B. An example of the average video signal of R, G and B is a luminance signal Y supplied from a television video signal processing circuit (not shown) through a signal line DL. The A/D converter 42c receives upper and lower reference potentials VH and VL from integrators 45c and 46c to be described in detail later, and a 3.12 MHz sampling clock $\phi$s from a clock signal generator (not shown). The A/D converter 42c compares the luminance signal Y with the potentials VH and VL. The converter 42c detects levels of the luminance signal Y which exceed the potential VH or are below the potential VL, and produces the detected levels as white and black level signals W and B in synchronism with the sampling clock $\phi$s. The signal W from the A/D converter 42c is supplied to a pulse generator 43c, and the signal B is supplied to a pulse generator 44c. The pulse generators 43c and 44c receive clock pulses $\phi$2, $\overline{CK1}$ and $\overline{CK2}$ from the control section. About 50,000 clock pulses $\phi$2 are generated in one field period. The clock pulse $\overline{CK2}$ is generated for each field, and the clock pulse $\overline{CK1}$ is generated with a delay time of several horizontal periods H from the clock pulse $\overline{CK2}$. Outputs from the pulse generators 43c and 44c are supplied to the integrators 45c and 46c, respectively. Operating voltages V1 and V2 are supplied to the integrator 45c, and operating voltages V1' and V2' are supplied to the integrator 46c. The integrator 45c integrates the voltage V1 or V2 in accordance with the signal from the pulse generator 43c, and supplies an integral value to the A/D converter 42c as the upper reference potential VH. The integrator 46c integrates the voltage V1' or V2' in accordance with the signal from the pulse generator 44c, and supplies an integral output to the A/D converter 42c as the lower reference potential VL. Outputs from the integrators 45c and 46c are level-shifted by level shifters 47a, 47b and 47c, respectively, and level-shifted signals are supplied to red, green and blue A/D converters 41a, 41b, and 41c as upper and lower reference potentials VH' and VL'. The A/D converters 41a, 41b and 41c respectively receive red, green and blue signals R, G and B from a color signal processor (not shown). The A/D converters 41a, 41b, and 41c convert the color signals R, G and B into 4-bit digital signals in accordance with the potentials VH' and VL' from the level shifters 47a, 47b and 47c, and supply them to a liquid crystal display device (not shown) using a liquid crystal display panel. The level shifters 47a, 47b and 47c have input terminals 6a1, 6b1, and 6c1 for manually adjusting the voltage level. With this arrangement, circuit portions other than the level shifters 47a, 47b and 47c can be formed into an LSI.

The operations of the apparatus of the above embodiment are the same as those described with reference to FIGS. 6 to 9, and a detailed description thereof will be omitted. In the embodiment described with reference to FIG. 12, a reference potential setting A/D converter separate from A/D converters for performing A/D conversion of color television video signals R, G and B is provided and the color television video signal is A/D converted in accordance with the reference potentials set by this special A/D converter, while the potentials set thereby are fed back thereto. With this apparatus, since A/D conversion can be performed with quick response to changes in brightness of the color television video signal, it can also respond to abrupt changes in an input color television video signal. Furthermore, even if the luminance components for the respective R, G and B components are different from each other, the reference potentials can be externally and independently set for each color, thereby obtaining desired hues.

What is claimed is:

1. A television video signal A/D converter comprising:
   A/D converting means for sampling a television video signal to A/D convert the signal in accordance with upper and lower reference potentials and for supplying the A/D converted television video signal to a liquid crystal display device;
   detecting means, connected to said A/D converting means, for detecting from the A/D converted digital signal, digital values exceeding a predetermined value and below a predetermined value which respectively correspond to the upper and lower reference potentials supplied for A/D conversion;
   counting means for respectively counting at least in one field the digital values exceeding the predetermined value and the digital values below the predetermined value which are detected by said detecting means; and
   reference potential producing means for determining the upper and lower reference potentials in accordance with counts of said counting means and supplying the upper and lower reference potentials to said A/D converting means.

2. An apparatus according to claim 1, wherein said A/D converting means comprises a single A/D converter.

3. An apparatus according to claim 1, wherein said A/D converting means comprises:
   first A/D converting means for sampling the television video signal to A/D convert the signal in accordance with the upper and lower reference potentials and supplying the A/D converted television video signal to said liquid crystal display device; and
   second A/D converting means for sampling the television video signal in accordance with a reference potential so as to transmit an A/D converted signal in accordance with fixed upper and lower reference potentials.

4. An apparatus according to claim 3, wherein said second A/D converting means A/D converts only white level exceeding a predetermined value and black level below a predetermined value of the television video signal, and produces digital values corresponding to the white and black levels of the A/D converted signal.

5. An apparatus according to claim 1, wherein said A/D converting means comprises:
   first A/D converting means for sampling the television video signal in accordance with the upper and lower reference potentials from said reference potential producing means and for supplying the A/D converted signal to said detecting means; and
   second A/D converting means, connected to said reference potential producing means, for A/D converting the television video signal in accordance with the upper and lower reference potentials and for supplying the A/D converted signal to said liquid crystal display device.

6. An apparatus according to claim 1, wherein said counting means comprises a single counting means and alternately counts at least each field digital values exceeding the predetermined value corresponding to the upper reference potential and digital values below the predetermined value corresponding to the lower reference potential.

7. An apparatus according to claim 1, wherein said counting means comprises first counting means for counting digital values exceeding the predetermined value corresponding to the upper reference potential, and second counting means for counting digital values below the predetermined value corresponding to the lower reference potential.

8. An apparatus according to claim 1, wherein said A/D converting means comprises luminance signal A/D converting means for A/D converting a luminance signal of the color television video signal in accordance with fixed upper and lower reference potentials; and color television video signal A/D converting means consisting of red, green and blue A/D converters for converting color signals of the color television video signal in accordance with the upper and lower reference potentials from said reference potential producing means.

9. An apparatus according to claim 8, wherein level shifter means are connected between said reference potential producing means and corresponding said red, green and blue A/D converters of said color television video signal A/D converting means.

10. An apparatus according to claim 1, wherein said A/D converting means comprises luminance signal A/D converting means for sampling a luminance signal of a color television video signal, A/D converting the signal in accordance with upper and lower reference potentials from said reference potential producing means, and supplying the A/D converted signal to said detecting means; and color television video signal A/D converting means, connected to said reference potential producing means and consisting of red, green and blue A/D converters, for A/D converting color signals of the color television video signal in accordance with the upper and lower reference potentials and supplying the A/D converted television signal to said liquid crystal display device.

11. An apparatus according to claim 10, wherein level shifter means are connected between said reference potential producing means and corresponding ones of said red, green and blue A/D converters of said color television signal A/D converting means.

12. An apparatus according to claim 1, wherein said reference potential producing means comprises clock signal counting means, and D/A converting means for converting a count of said clock signal counting means into a voltage.

13. An apparatus according to claim 1, wherein said reference potential producing means comprises D/D converting means for D/D converting a count of said clock producing means into a pulse width, and an integrator for converting the pulse width into a voltage.

* * * * *